(12) United States Patent
Hao et al.

(10) Patent No.: US 12,295,269 B2
(45) Date of Patent: May 6, 2025

(54) LOW-COST AND HIGH-STRENGTH BI-BASED SUPERCONDUCTING WIRE/TAPE AND PREPARATION METHOD THEREOF

(71) Applicant: NORTHWEST INSTITUTE FOR NONFERROUS METAL RESEARCH, Xi'an (CN)

(72) Inventors: Qingbin Hao, Xi'an (CN); Jianfeng Li, Xi'an (CN); Shengnan Zhang, Xi'an (CN); Lihua Jin, Xi'an (CN); Xiaoyan Xu, Xi'an (CN); Gaofeng Jiao, Xi'an (CN); Kai Yao, Xi'an (CN); Chengshan Li, Xi'an (CN); Guoqing Liu, Xi'an (CN); Zhenbao Li, Xi'an (CN); Xueqian Liu, Xi'an (CN); Gaoshan Li, Xi'an (CN); Jianqing Feng, Xi'an (CN); Pingxiang Zhang, Xi'an (CN)

(73) Assignee: NORTHWEST INSTITUTE FOR NONFERROUS METAL RESEARCH, Xi'an (CN)

( * ) Notice: Subject to any disclaimer, the term of this patent is extended or adjusted under 35 U.S.C. 154(b) by 0 days.

(21) Appl. No.: 18/654,071

(22) Filed: May 3, 2024

(65) Prior Publication Data

US 2024/0389474 A1 Nov. 21, 2024

Related U.S. Application Data

(63) Continuation of application No. PCT/CN2024/071771, filed on Jan. 11, 2024.

(30) Foreign Application Priority Data

May 19, 2023 (CN) .......................... 202310565846.9

(51) Int. Cl.
*H10N 60/01* (2023.01)
*H10N 60/85* (2023.01)

(52) U.S. Cl.
CPC ....... *H10N 60/0128* (2023.02); *H10N 60/855* (2023.02)

(58) Field of Classification Search
CPC .................................................. H10N 60/0128
See application file for complete search history.

(56) References Cited

U.S. PATENT DOCUMENTS

| | | | | |
|---|---|---|---|---|
| 2010/0248969 A1* | 9/2010 | Fujikami | ............ | H10N 60/0801 505/231 |
| 2011/0244234 A1 | 10/2011 | Taneda et al. | | |
| 2020/0005968 A1* | 1/2020 | van der Laan | ........ | H01B 12/04 |

FOREIGN PATENT DOCUMENTS

| | | |
|---|---|---|
| CN | 110875106 A | 3/2020 |
| CN | 113270235 A | 8/2021 |

(Continued)

OTHER PUBLICATIONS

GB/T 11067.1-2006, Methods for chemical analysis of silver-Determination of silver content-Silver chloride precipitation-flame atomic absorption spectrometric method, China National Standarts, 2006, pp. 1-3, General Administration of Quality Supervision, Inspection and Quarantine of the People's Republic of China.

(Continued)

*Primary Examiner* — Paul A Wartalowicz
(74) *Attorney, Agent, or Firm* — Bayramoglu Law Offices LLC

(57) ABSTRACT

A low-cost and high-strength Bi-based superconducting wire/tape and a preparation method thereof, the preparation method includes: 1. subjecting a first Bi-based superconducting wire/tape to electrochemical silver reduction to remove a Ag alloy layer to obtain a second Bi-based superconducting wire/tape; and 2. subjecting the second (Continued)

Bi-based superconducting wire/tape to surface enhancement, such that a Cu layer is formed to obtain the low-cost and high-strength Bi-based superconducting wire/tape. An electrochemical silver reduction technology combines with an electrochemical additive method to remove a Ag alloy layer on a surface of a Bi-based superconducting wire/tape and coat a high-strength Cu layer, such that a low-cost and high-strength Bi-based superconducting wire/tape can be prepared, which reduces a preparation cost and improves a strength of a Bi-based superconducting wire/tape to meet the application requirements of large super-strong magnets.

8 Claims, 2 Drawing Sheets

(56) References Cited

FOREIGN PATENT DOCUMENTS

| CN | 114843044 A | 8/2022 |
|---|---|---|
| CN | 116580892 A | 8/2023 |

OTHER PUBLICATIONS

GB/T 36611-2018/IEC 61788-18:2013, Mechanical properties measurement-Room temperature tensile test of Ag-and/ or Ag alloy-sheathed Bi-2223 and Bi-2212 composite superconductors, China National Standarts, 2018, pp. 1-28, State Administration of Market Regulation.

GB/T 18502-2018/IEC 61788-3: 2006, Critical current measurement-DC critical current of Ag-and/ or Ag alloy sheathed Bi-2212 and Bi-2223 oxide superconductors, China National Standarts, 2018, pp. 1-14, General Administration of Quality Supervision, Inspection and Quarantine of the People's Republic of China.

K. Fisher, et al., The Influence of Processing Parameters and Tensile Stresses on the Properties of Bi-2223 Tapes with Ag and AgMn Sheaths, IEEE Transactions on Applied Superconductivity, 1999, pp. 2625-2628, vol. 9 No.2.

Zhe-Hua Mao, et al., Axial Tensile Stress-Strain Characterization of Bi-2212 Round Wire With Different Heat Treatments, IEEE Transactions on Applied Superconductivity, 2017, vol. 27 No.6, 6400405.

Hyung-Seop Shin, et al., Critical current degradation behaviour in Bi-2223 superconducting tapes under bending and torsion strains, Superconductor Science and Technology, 2003, pp. 1012-1018, vol. 16.

* cited by examiner

LOW-COST AND HIGH-STRENGTH BI-BASED SUPERCONDUCTING WIRE/TAPE AND PREPARATION METHOD THEREOF

CROSS REFERENCE TO RELATED APPLICATIONS

The present application is a continuation application of International Application No. PCT/CN2024/071771, filed on Jan. 11, 2024, which claims priority to Chinese Patent Application 202310565846.9 filed on May 19, 2023, which is incorporated herein by reference in its entirety.

TECHNICAL FIELD

The present disclosure belongs to the technical field of preparation of high-temperature superconducting wires/tapes, and specifically relates to a low-cost and high-strength Bi-based superconducting wire/tape and a preparation method thereof.

BACKGROUND

Bi-based high-temperature superconducting wires/tapes have excellent current-carrying performance, an ultra-high upper critical field of about 100 T, and a superconducting transition temperature of 77 K or higher. Thus, they have a promising application prospect in the fields of power transmission in a liquid nitrogen temperature zone and strong magnetic fields of liquid helium. Bi-based high-temperature superconducting wires/tapes have been used in magnets for producing ultra-strong nuclear magnetic resonance (NMR) magnetic fields, superconducting cables, superconducting current limiters, superconducting energy-storage magnets, fusion superconducting magnets, and accelerator magnets.

Bi-based wires/tapes are prepared by a powder-in-tube method. Specifically, a precursor ceramic oxide powder is loaded into a silver tube to prepare a single-core composite, then single-core wire drawing or multi-core wire bundle drawing or rolling is conducted, and a resulting product is subjected to a heat treatment to obtain a high-performance Bi-based wire/tape. A partial oxygen pressure around a superconducting core wire needs to remain constant throughout a heat treatment process; otherwise, segregation will occur, resulting in a significant decline in the current-carrying performance of a sample. An oxide core wire absorbs oxygen during a heating-up process, and a superconducting core wire releases oxygen during a heat-preservation process, which will lead to a real-time change in a partial oxygen pressure around the core wire. Therefore, an oxygen-permeable material must be used in preparation of a sheathing material for a Bi-based superconducting wire/tape. In addition, a sheathing material should not react with a Bi-based precursor powder. Currently, only silver and silver alloys as sheathing materials can meet these two conditions. Therefore, only Ag and Ag alloys can be used as sheathing materials for preparing Bi-based superconducting wires/tapes. However, Ag and Ag alloys as sheathing materials have the following disadvantages:

(1) An excessively high content of pure Ag and Ag alloys (the Ag alloys used for Bi-based superconducting wires/tapes have a Ag content of more than 99%) will lead to an extremely high cost of a corresponding Bi-based superconducting wire/tape. A content of Ag and Ag alloys in a Bi-based superconducting tape is close to 70%, and a content of Ag and Ag alloys in a Bi-based superconducting wire is more than 80%. Ag and Ag alloys are precious metals with much higher prices than other metals, and thus costs of Bi-based superconducting wires/tapes remain high, which restricts the large-scale application of Bi-based superconducting wires/tapes. Therefore, in order to allow the large-scale application of Bi-based superconducting wires/tapes, it is necessary to reduce a Ag content to reduce a cost.

(2) An excessively high content of Ag and Ag alloys will lead to an extremely low strength of a corresponding Bi-based superconducting wire/tape. As the most important application, Bi-based superconducting wires/tapes are used in strong magnetic fields of 30 T or more. A strong magnetic field has a strong interaction with a superconducting current in a superconducting wire/tape, resulting in a large tensile stress on the superconducting wire/tape. Moreover, the larger the aperture of a superconducting magnet, the larger the tensile stress on a superconducting wire/tape. However, because Ag and Ag alloys have a relatively-low strength, Bi-based superconducting wires/tapes with Ag and Ag alloys as sheathing materials can hardly meet the requirements of strong-magnetic field magnets. Therefore, in order to allow the application of Bi-based superconducting wires/tapes in super-strong magnetic fields, it is necessary to improve a strength of conventional Bi-based superconducting wires/tapes.

(3) A critical engineering current density of an enhanced Bi-based superconducting wire/tape is greatly reduced. The current enhanced Bi-based superconducting wire/tape is obtained by directly welding a high-strength metal tape on a surface of a Bi-based superconducting wire/tape. Compared with the original superconducting wire/tape, the enhanced superconducting wire/tape has a significantly-increased thickness or diameter, such that a critical engineering current density of a sample will be greatly reduced, which significantly increases a size of a superconducting device prepared from the enhanced superconducting wire/tape and significantly increases a refrigeration cost of a superconducting device and a cost of a superconducting material. Therefore, in order to allow the large-scale application of an enhanced Bi-based superconducting wire/tape, it is necessary to reduce the size of the enhanced Bi-based superconducting wire/tape and increase the critical engineering current density of the enhanced Bi-based superconducting wire/tape.

SUMMARY

The technical problem to be solved by the present disclosure is to provide a low-cost and high-strength Bi-based superconducting wire/tape and a preparation method thereof in view of the deficiencies in the prior art. The preparation method combines an electrochemical silver reduction technology with an electrochemical additive method to remove a Ag alloy layer on a surface of a Bi-based superconducting wire/tape and coat a high-strength Cu layer, such that a low-cost and high-strength Bi-based superconducting wire/tape can be prepared, which reduces a cost of the Bi-based superconducting wire/tape, improves a strength of the Bi-based superconducting wire/tape, and solves the problem that the Bi-based superconducting wire/tape has a high cost and a low strength due to the wrapping with Ag or a Ag alloy.

In order to solve the above-mentioned technical problem, in a first aspect, the present disclosure provides a preparation method of a low-cost and high-strength Bi-based superconducting wire/tape, including:

step 1: electrochemical silver reduction: connecting a first Bi-based superconducting wire/tape to a positive electrode of a stabilized voltage power supply, connecting a graphite electrode to a negative electrode of the stabilized voltage power supply, and arranging the first Bi-based superconducting wire/tape and the graphite electrode in parallel on a bracket; and adding an electrolyte to allow the electrochemical silver reduction, such that a Ag alloy layer on a surface of the first Bi-based superconducting wire/tape is removed to obtain a second Bi-based superconducting wire/tape; and step 2: surface enhancement: connecting the second Bi-based superconducting wire/tape obtained after the electrochemical silver reduction in the step 1 to the negative electrode of the stabilized voltage power supply, connecting a copper sheet to the positive electrode of the stabilized voltage power supply, and arranging the second Bi-based superconducting wire/tape and the copper sheet in parallel on the bracket; and adding an electrochemical additive solution to allow the surface reinforcement, such that a Cu layer is formed on a surface of the second Bi-based superconducting wire/tape to obtain the low-cost and high-strength Bi-based superconducting wire/tape.

In the first Bi-based superconducting wire/tape adopted in the present disclosure, Ag and/or a Ag alloy is/are used as a sheathing material.

For the preparation method of a low-cost and high-strength Bi-based superconducting wire/tape, in the step 1, a width of the graphite electrode is greater than or equal to 3 times, preferably 3 to 5 times, and more preferably 3 times a width or a diameter of the first Bi-based superconducting wire/tape; and/or the electrolyte is a deionized aqueous solution including a soluble silver salt at a concentration of 2 g/L to 10 g/L, and a pH of the deionized aqueous solution including the soluble silver salt is adjusted with a metal hydroxide to 3 to 5, where preferably, the concentration of the soluble silver salt in the deionized aqueous solution is 6 g/L. In the present disclosure, the pH of the electrolyte is controlled to avoid a damage to a superconducting core wire in the Bi-based superconducting wire/tape while allowing the electrochemical silver reduction.

For the preparation method of a low-cost and high-strength Bi-based superconducting wire/tape, the soluble silver salt is selected from one of silver nitrate, silver fluoride, silver chlorate, and silver perchlorate; and/or the metal hydroxide is selected from one of sodium hydroxide, potassium hydroxide, barium hydroxide, and lithium hydroxide.

For the preparation method of a low-cost and high-strength Bi-based superconducting wire/tape, in the step 1, a distance between the first Bi-based superconducting wire/tape and the graphite electrode is 1 cm to 5 cm and preferably 3.5 cm; and/or a current density of a surface of the first Bi-based superconducting wire/tape is 0.1 A/dm$^2$ to 10 A/dm$^2$ and preferably 5 A/dm$^2$; and/or a power-on time is 0.1 min to 30 min and preferably 3 min.

For the preparation method of a low-cost and high-strength Bi-based superconducting wire/tape, in the step 2, the electrochemical additive solution is a deionized aqueous solution including a soluble copper salt at a concentration of 0.1 g/L to 20 g/L and an acidic substance at a concentration of 10 g/L to 50 g/L;

the concentration of the soluble copper salt is preferably 10 g/L; and the concentration of the acidic substance is preferably 30 g/L.

For the preparation method of a low-cost and high-strength Bi-based superconducting wire/tape, the soluble copper salt is selected from one of copper sulfate, copper chloride, and copper nitrate; and/or the acidic substance is selected from one of citric acid, sulfuric acid, hydrochloric acid, nitric acid, and phosphoric acid.

For the preparation method of a low-cost and high-strength Bi-based superconducting wire/tape, in the step 2, a distance between the second Bi-based superconducting wire/tape and the copper sheet is 2 cm to 5 cm and preferably 3.5 cm; and/or a current density of the surface of the second Bi-based superconducting wire/tape is 0.1 A/dm$^2$ to 10 A/dm$^2$ and preferably 5 A/dm$^2$; and/or the surface enhancement is conducted for 0.1 min to 20 min and preferably 10 min; and/or a thickness of the Cu layer is 10 μm to 40 μm and preferably 25 μm.

Before the step 1, the preparation method of a low-cost and high-strength Bi-based superconducting wire/tape further includes:

surface cleaning: cleaning a surface of the first Bi-based superconducting wire/tape with ethanol to remove residual dirt on the surface of the first Bi-based superconducting wire/tape.

Before the step 2, the preparation method of a low-cost and high-strength Bi-based superconducting wire/tape further includes:

residual electrolyte removal: soaking the second Bi-based superconducting wire/tape obtained after the electrochemical silver reduction in the step 1 in ultrapure water to remove a residual electrolyte on the surface of the second Bi-based superconducting wire/tape.

In a second aspect, the present disclosure also provides a low-cost and high-strength Bi-based superconducting wire/tape prepared by the preparation method of a low-cost and high-strength Bi-based superconducting wire/tape described above.

Compared with the prior art, the present disclosure has the following advantages:

1. In view of the problem that the existing Bi-based superconducting wire/tape has a high cost due to a Ag content of 66% to 82% because a precious metal Ag or a Ag alloy must be used as a sheathing material, in the present disclosure, an electrochemical silver reduction technology is first used to remove a Ag alloy layer on a surface of a Bi-based superconducting wire/tape, such that an effective Ag content in the Bi-based superconducting wire/tape is reduced to about 50% and a cost of the Bi-based superconducting wire/tape is reduced by nearly 45%; and then a high-strength Cu layer is coated on a surface of a Bi-based superconducting wire/tape with the Ag alloy layer removed to allow surface enhancement, thereby allowing the preparation of a low-cost and high-strength Bi-based superconducting wire/tape. Compared with the original Bi-based superconducting wire/tape, the low-cost and high-strength Bi-based superconducting wire/tape has a Ag mass content reduced by 1 time or less and a superconducting critical strength improved by 2 times or more. In addition, the electrochemical silver reduction is a controllable Ag reduction process with an ultra-low stress or even no stress, which can avoid a damage to a ceramic superconducting core caused by a too-high stress of conventional mechanical silver reduction, thereby avoiding a loss of superconducting performance of the Bi-based superconducting wire/tape.

2. In the present disclosure, an electrochemical additive method is used to coat a high-strength Cu layer instead of a Ag alloy on a surface of a Bi-based superconducting wire/tape, such that a strength, especially a yield strength, of the Bi-based superconducting wire/tape is improved to adapt to a strong tensile stress generated due to a strong interaction between a strong magnetic field formed by the Bi-based superconducting wire/tape and a current, which solves the problem that a low strength of Ag and Ag alloy sheathing materials causes a small mechanical support of a Bi-based superconducting wire/tape and makes Bi-based superconducting wires/tapes meet the application requirements of large super-strong magnets, thereby promoting the development of large Bi-based super-strong superconducting magnets and fusion, accelerator, and large-aperture NMR.

3. In the present disclosure, an electrochemical silver reduction technology is used to produce electrochemical additive manufactured Ag on a surface of a graphite electrode while removing a Ag alloy layer on a surface of a Bi-based superconducting wire/tape, and the electrochemical additive manufactured Ag has a quality purity of 99.9% or more and can be directly prepared into a Ag tube for preparing a Bi-based superconducting wire/tape, which allows the recycling of Ag, reduces a waste, and further reduces a cost of a Bi-based superconducting wire/tape.

4. In the present disclosure, an electrochemical additive method is used to coat a high-strength Cu layer instead of Ag or a Ag alloy with a low strength on a surface of a Bi-based superconducting wire/tape, which greatly improves a strength of the Bi-based superconducting wire/tape and reduces a damage to the Bi-based superconducting wire/tape during cable and magnet winding processes. Thus, the low-cost and high-strength Bi-based superconducting wire/tape of the present disclosure is suitable for preparation of cables and magnets.

5. In the present disclosure, a thickness of a Cu layer can be adjusted by controlling a surface enhancement process to control a diameter or thickness of a Bi-based superconducting wire/tape, such that wires/tapes with different critical bend radii can be prepared, which greatly reduces a cost of the Bi-based superconducting wire/tape, allows the preparation of a Bi-based superconducting wire/tape with a small diameter or thickness, and reduces a critical bend radius of a Bi-based superconducting wire/tape to make the Bi-based superconducting wire/tape suitable for preparation of a small-aperture magnet.

6. The preparation method of the present disclosure involves a simple process and a reasonable process design, allows the batch preparation of a low-cost and high-strength Bi-based wire/tape, and is of great significance for promoting the industrialization and application of Bi-based superconducting wires/tapes.

The technical solutions of the present disclosure will be further described in detail below with reference to accompanying drawings and embodiments.

REFERENCE NUMERALS

Figure 1:
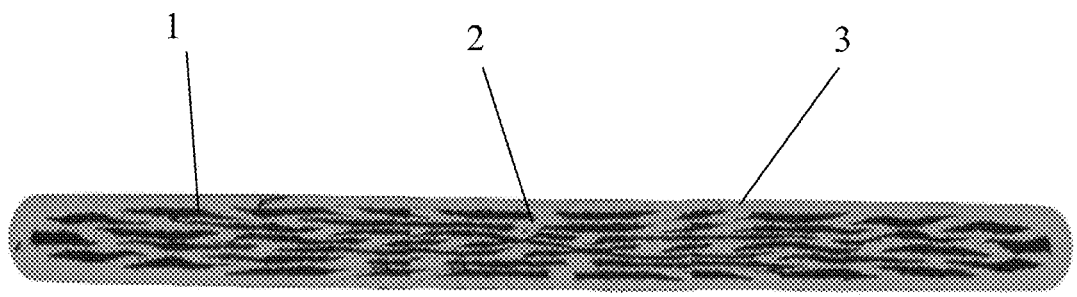
FIG. 1 is a schematic structural diagram of a Bi-based superconducting tape adopted in Example 1 of the present disclosure.

1: superconducting core wire, 2: Ag layer, 3: Ag alloy layer, and 4: Cu layer.

DETAILED DESCRIPTION OF THE EMBODIMENTS

The technical solutions in the examples of the present disclosure are clearly and completely described below with reference to the accompanying drawings of the present disclosure. Apparently, the described examples are merely a part rather than all of the examples of the present disclosure. The experimental methods in the following examples which are not specified with specific conditions are conducted according to conventional conditions or according to product instructions.

Performance Testing

The products prepared in examples and comparative examples each are tested for application performance, and test standards or methods are as follows:

1. Ag Content Test

According to the GB/T 11067.1-2006 "Methods For Chemical Analysis Of Silver—Determination Of Silver Content—Silver Chloride Precipitation-Flame Atomic Absorption Spectrometric Method", a Ag content is determined.

2. Breaking Strength Test

According to the GB/T 36611-2018 "Mechanical Properties Measurement—Room Temperature Tensile Test of Ag- and/or Ag alloy-sheathed Bi-2223 and Bi-2212 Composite Superconductors", a breaking strength is tested.

3. Cost Accounting

In a cost of a conventional Bi-based superconducting wire/tape, a cost of a Ag raw material accounts for about 96%, a cost of other raw materials accounts for 2%, and a processing cost accounts for 2%. In the present disclosure, an outer Ag layer of a Bi-based superconducting wire/tape is replaced with Cu, and a half of Ag in the Bi-based superconducting wire/tape is replaced. A price of a Cu raw material is merely $1/100$ of a price of a Ag raw material. A processing cost of replacing Ag with copper (including electrochemical Ag reduction and electrochemical additive processing costs) accounts for about 20% of the price of the Cu raw material. According to the standard that a cost of a conventional Bi-based superconducting wire/tape is 100%, a calculation method of a cost of the superconducting wire/tape in the present disclosure is as follows:

cost reduction rate=100%−a cost of the replacement raw material Cu−a cost of replacement processing−a remaining Ag raw material in a superconducting tape−cost of other materials and processing.

4. Superconducting Critical Current

According to the GB/T 18502-2018/IEC 61788-3:2006 "Critical Current Measurement—DC Critical Current of Ag- and/or Ag alloy-sheathed Bi-2212 and Bi-2223 Oxide Superconductors", a superconducting critical current is tested.

5. Superconducting Critical Tensile Strength Test

A tensile force is applied to two ends of a wire/tape sample in a length direction, and a superconducting critical current of the sample is tested in situ. When a critical current of a sample drops to 95% of a critical current of the sample in a stress-free state, a corresponding tensile force is a superconducting critical tensile strength of the sample (Fischer K, Fahr T, Schlafer U, et al. Impacts of Processing Parameters and Tensile Stress on Performance of Bi-2223 Tapes (with Ag and AgMn Sheaths) [J]. IEEE transactions on applied superconductivity, 1999, 9 (2): 2625-2628) and (Mao Z H, Jin H, Qin J G, et al. Axial Tensile Stress-Strain Characteristics of Bi-2212 Round Wires under Different Heat Treatment Conditions [J]. IEEE Transactions on Applied Superconductivity, 2017, 27 (6): 6400405).

6. Critical Bend Radius

A wire/tape sample is uniformly bent in a length direction of the wire/tape sample, and a superconducting critical current of the sample is tested in situ. When a critical current of a sample drops to 95% of a critical current of a straight sample, a corresponding bend radius is a superconducting critical bend radius of the sample (Shin H S, Katagiri K. Critical Current Degradation Behaviors of Bi-2223 Superconducting Tape under Bending and Torsional Strains [J]. Superconductor Science and Technology, 2003, 16 (9): 1012-1018).

Example 1

This example includes the following steps:

Step 1: Surface scrubbing: A surface of a first Bi-based superconducting tape (as shown in FIG. 1) was scrubbed with an ethanol-moistened cotton cloth to remove the dirt left on the surface of the first Bi-based superconducting tape during a heat treatment to obtain a second Bi-based superconducting tape.

Step 2: Electrochemical silver reduction: The second Bi-based superconducting tape obtained after the surface scrubbing in the step 1 was connected to a positive electrode of a stabilized voltage power supply, a graphite electrode was connected to a negative electrode of the stabilized voltage power supply, and then the second Bi-based superconducting tape and the graphite electrode were arranged in parallel on a bracket; and then an electrolyte was added to allow the electrochemical silver reduction, such that a Ag alloy layer on a surface of the second Bi-based superconducting tape was removed to expose a silver layer on a surface of an outer superconducting core wire layer of the second Bi-based superconducting tape to obtain a third Bi-based superconducting tape and electrochemical additive manufactured Ag with a mass purity of 99.99% was produced on a surface of the graphite electrode. A width of the graphite electrode was 12 mm and a width of the second Bi-based superconducting tape was 4 mm, that is, the width of the graphite electrode was 3 times the width of the second Bi-based superconducting tape. A distance between the second Bi-based superconducting tape and the graphite electrode was 1 cm. The electrolyte was a 2 g/L $AgNO_3$ solution, and a pH of the $AgNO_3$ solution was adjusted with sodium hydroxide to 3. During the electrochemical silver reduction, a current density of the surface of the second Bi-based superconducting tape was adjusted to 0.1 $A/dm^2$, and a power-on time was 30 min.

Step 3: Residual electrolyte removal: The third Bi-based superconducting tape obtained after the electrochemical silver reduction in the step 2 was soaked in ultrapure water to remove a residual electrolyte on a surface of the third Bi-based superconducting tape to obtain a fourth Bi-based superconducting tape.

Figure 2:
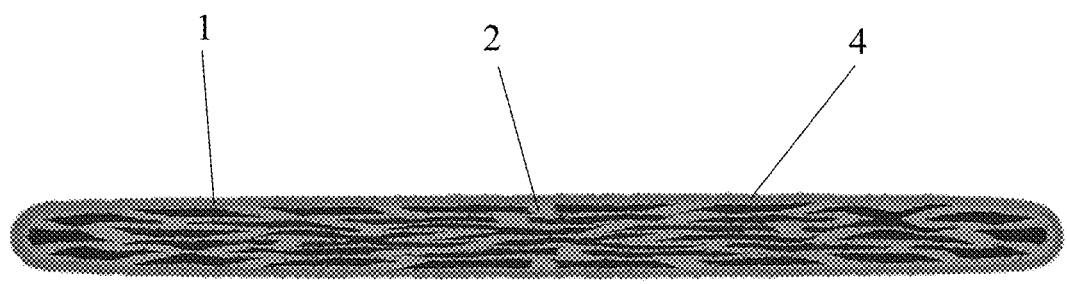
FIG. 2 is a schematic structural diagram of a low-cost and high-strength Bi-based superconducting tape prepared in Example 1 of the present disclosure.

Step 4: Surface enhancement: The fourth Bi-based superconducting tape obtained after the residual electrolyte removal in the step 3 was connected to the negative electrode of the stabilized voltage power supply, a copper sheet was connected to the positive electrode of the stabilized voltage power supply, and then the fourth Bi-based superconducting tape and the copper sheet were arranged in parallel on the bracket; and an electrochemical additive solution was added to allow the surface enhancement, such that a Cu layer with a thickness of 20 μm was formed on a surface of the fourth Bi-based superconducting tape to obtain a low-cost and high-strength Bi-based superconducting tape (as shown in FIG. 2). A distance between the fourth Bi-based superconducting tape and the copper sheet was 2 cm. The electrochemical additive solution included 0.1 g/L copper sulfate and 10 g/L citric acid. During the surface enhancement, a current density of the surface of the fourth Bi-based superconducting tape was adjusted to 0.1 $A/dm^2$; and the surface enhancement was conducted for 20 min.

According to test results, for the low-cost and high-strength Bi-based superconducting tape prepared in this example, a Ag mass content is reduced from 66% in the first Bi-based superconducting tape to 33%, a breaking strength is increased from 90 MPa to 94 MPa of the first Bi-based superconducting tape to 102 MPa to 104 MPa, and a superconducting critical tensile strength at 77 K is increased from 5 kg of the first Bi-based superconducting tape to 14 kg, indicating enhanced mechanical properties. The low-cost and high-strength Bi-based superconducting tape prepared in this example and the first Bi-based superconducting tape exhibit completely-consistent superconducting critical current-carrying performance, and both have a superconducting critical current of 53 A at self-field 77 K, which further confirms that the electrochemical Ag reduction and electrochemical copper deposition processes have no impact on the performance of a superconducting core wire.

| Cost of an original tape | Cost of a total Ag material in the original tape | Cost of a copper raw material | Cost of replacement processing | Cost of the remaining Ag material in a superconducting tape | Cost of other materials and processing | Cost reduction rate |
|---|---|---|---|---|---|---|
| 100% | 96.0% | 0.48% | 0.096% | 48% | 4.0% | 47.424% |

In this example, copper is used instead of nearly a half of the precious metal Ag in the first Bi-based superconducting tape, such that a cost reduction rate for the first Bi-based superconducting tape reaches 47.424% without reducing the current-carrying performance. The enhanced mechanical properties allow the low-cost and high-strength Bi-based superconducting tape to be used under severe magnetic field or pressure conditions, which broadens an application range of the Bi-based superconducting tape.

FIG. 1 is a schematic structural diagram of the first Bi-based superconducting tape adopted in Example 1, including: superconducting core wire 1, a Ag layer wrapping around the superconducting core wire 1, and outermost Ag alloy layer 3. FIG. 2 is a schematic structural diagram of the low-cost and high-strength Bi-based superconducting tape prepared in Example 1, including: superconducting core wire 1, a Ag layer wrapping around the superconducting core wire 1, and outermost Cu layer 4. It can be seen from the comparison between FIG. 1 and FIG. 2 that the present disclosure adopts an electrochemical silver reduction technology and an electrochemical additive method to remove a Ag alloy layer on a surface of a Bi-based superconducting wire/tape and coat a high-strength Cu layer instead.

Example 2

Figure 3:
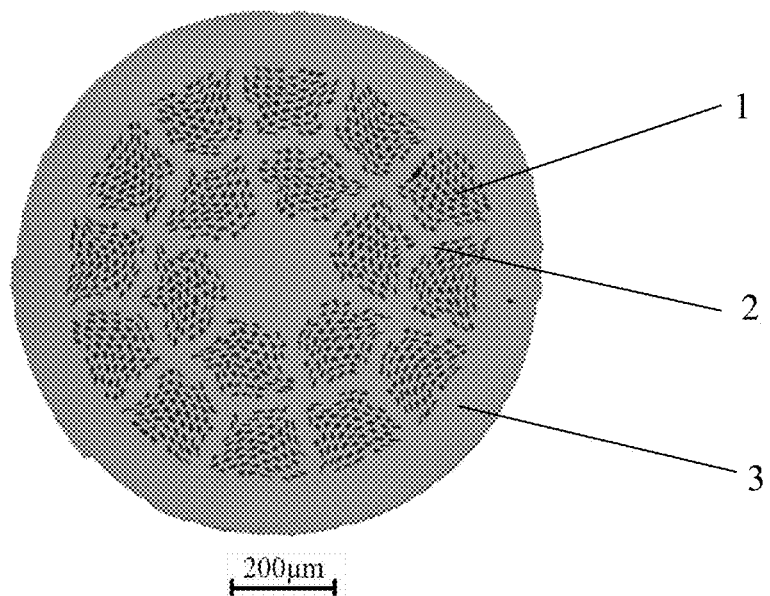
FIG. 3 is a schematic structural diagram of a Bi-based superconducting wire adopted in Example 2 of the present disclosure.

This example includes the following steps:

Step 1: Surface scrubbing: A surface of a first Bi-based superconducting wire (as shown in FIG. 3) was scrubbed with an ethanol-moistened cotton cloth to remove the dirt left on the surface of the first Bi-based superconducting wire during a heat treatment to obtain a second Bi-based superconducting wire.

Step 2: Electrochemical silver reduction: The second Bi-based superconducting wire obtained after the surface scrubbing in the step 1 was connected to a positive electrode of a stabilized voltage power supply, a graphite electrode was connected to a negative electrode of the stabilized voltage power supply, and then the second Bi-based superconducting wire and the graphite electrode were arranged in parallel on a bracket; and then an electrolyte was added to allow the electrochemical silver reduction, such that a Ag alloy layer on a surface of the second Bi-based superconducting wire was removed to expose a silver layer on a surface of an outer superconducting core wire layer of the second Bi-based superconducting wire to obtain a third Bi-based superconducting wire and electrochemical additive manufactured Ag with a mass purity of 99.99% was produced on a surface of the graphite electrode. A width of the graphite electrode was 16 mm and a diameter of the second Bi-based superconducting tape was 4 mm, that is, the width of the graphite electrode was 4 times the diameter of the second Bi-based superconducting tape. A distance between the second Bi-based superconducting wire and the graphite electrode was 1 cm. The electrolyte was a 2 g/L $AgNO_3$ solution, and a pH of the $AgNO_3$ solution was adjusted with sodium hydroxide to 3. During the electrochemical silver reduction, a current density of the surface of the second Bi-based superconducting wire was adjusted to 10 $A/dm^2$, and a power-on time was 15 min.

Step 3: This step was the same as in Example 1.

Figure 4:
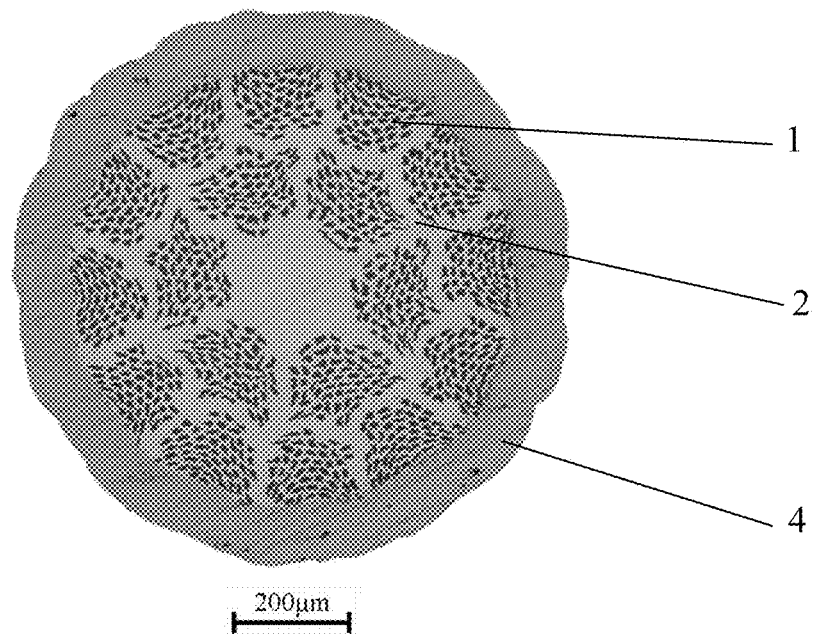
FIG. 4 is a schematic structural diagram of a low-cost and high-strength Bi-based superconducting wire prepared in Example 2 of the present disclosure.

Step 4: This step was different from Example 1 in that: The electrochemical additive solution included 2 g/L copper sulfate and 10 g/L citric acid. During the surface enhancement, a current density of the surface of the fourth Bi-based superconducting wire was adjusted to 3 $A/dm^2$; and the surface enhancement was conducted for 15 min. A Cu layer with a thickness of 40 μm was formed on the surface of the fourth Bi-based superconducting wire to obtain a low-cost and high-strength Bi-based superconducting wire (as shown in FIG. 4)

According to test results, for the low-cost and high-strength Bi-based superconducting wire prepared in this example, a Ag mass content is reduced from 80% in the first Bi-based superconducting wire to 40%, a breaking strength is increased from 100 MPa of the first Bi-based superconducting wire to 135 MPa, and a superconducting critical tensile strength at 77 K is increased from 7 kg of the first Bi-based superconducting wire to 17 kg, indicating enhanced mechanical properties. The low-cost and high-strength Bi-based superconducting wire prepared in this example and the first Bi-based superconducting wire exhibit completely-consistent superconducting critical current-carrying performance, and both have a superconducting critical current of 17 A at self-field 77 K, which further confirms that the electrochemical Ag reduction and electrochemical copper deposition processes have no impact on the performance of a superconducting core wire.

| Cost of an original tape | Cost of a total Ag material in the original tape | Cost of a copper raw material | Cost of replacement processing | Cost of the remaining Ag material in a superconducting tape | Cost of other materials and processing | Cost reduction rate |
| --- | --- | --- | --- | --- | --- | --- |
| 100% | 96.5% | 0.48% | 0.096% | 48% | 3.5% | 47.924% |

In this example, copper is used instead of the precious metal Ag in the first Bi-based superconducting wire, such that a cost reduction rate for the first Bi-based superconducting wire reaches 47.924% without reducing the current-carrying performance. The enhanced mechanical properties allow the low-cost and high-strength Bi-based superconducting wire to be used under a magnetic field or a pressure increased by 30% or more, which broadens an application range of the Bi-based superconducting wire.

FIG. 3 is a schematic structural diagram of the first Bi-based superconducting tape adopted in Example 1, including: superconducting core wire 1, a Ag layer wrapping around the superconducting core wire 1, and outermost Ag alloy layer 3. FIG. 4 is a schematic structural diagram of the low-cost and high-strength Bi-based superconducting tape prepared in Example 2, including: superconducting core wire 1, a Ag layer wrapping around the superconducting core wire 1, and outermost Cu layer 4. It can be seen from the comparison between FIG. 3 and FIG. 4 that the present disclosure adopts an electrochemical Ag reduction technology and an electrochemical additive method to remove a Ag alloy layer on a surface of a Bi-based superconducting wire/tape and coat a high-strength Cu layer instead.

Example 3

This example includes the following steps:

Step 1: Surface scrubbing: A surface of a first Bi-based superconducting tape was scrubbed with an ethanol-moistened cotton cloth to remove the dirt left on the surface of the first Bi-based superconducting tape during a heat treatment to obtain a second Bi-based superconducting tape.

Step 2: Electrochemical silver reduction: The second Bi-based superconducting tape obtained after the surface scrubbing in the step 1 was connected to a positive electrode of a stabilized voltage power supply, a graphite electrode was connected to a negative electrode of the stabilized voltage power supply, and then the second Bi-based superconducting tape and the graphite electrode were arranged in parallel on a bracket; and then an electrolyte was added to allow the electrochemical silver reduction, such that a Ag alloy layer on a surface of the second Bi-based superconducting tape was removed to expose a silver layer on a surface of an outer superconducting core wire layer of the second Bi-based superconducting tape to obtain a third Bi-based superconducting tape and electrochemical additive manufactured Ag with a mass purity of 99.99% was produced on a surface of the graphite electrode. A width of the graphite electrode was 20 mm and a width of the second Bi-based superconducting tape was 4 mm, that is, the width of the graphite electrode was 5 times the width of the second Bi-based superconducting tape. A distance between the second Bi-based superconducting tape and the graphite electrode was 5 cm. The electrolyte was a 10 g/L $AgNO_3$ solution, and a pH of the $AgNO_3$ solution was adjusted with sodium hydroxide to 5. During the electrochemical silver reduction, a current density of the surface of the second Bi-based superconducting tape was adjusted to 10 $A/dm^2$, and a power-on time was 0.1 min.

Step 3: This step was the same as in Example 1.

Step 4: This step was different from Example 1 in that: A distance between the fourth Bi-based superconducting wire/tape and the copper sheet was 5 cm. The electrochemical additive solution included 20 g/L copper chloride and 50 g/L sulfuric acid. During the surface enhancement, a current density of the surface of the fourth Bi-based superconducting tape was adjusted to 10 $A/dm^2$; and the surface enhancement was conducted for 0.1 min. A Cu layer with a thickness of 10 μm was formed on the surface of the fourth Bi-based superconducting tape to obtain a low-cost and high-strength Bi-based superconducting tape.

tent superconducting critical current-carrying performance, and both have a superconducting critical current of 56 A at self-field 77 K, which further confirms that the electrochemical Ag reduction and electrochemical copper deposition processes have no impact on the performance of a superconducting core wire. Although mechanical properties of the low-cost and high-strength Bi-based superconducting tape have not been improved significantly, a critical bend radius of the low-cost and high-strength Bi-based superconducting tape has been reduced from the original 3 cm to 2.5 cm, and thus the low-cost and high-strength Bi-based superconducting tape can be used in the field requiring small bend radii.

Example 4

This example includes the following steps:

Step 1: This step was the same as in Example 1.

Step 2: Electrochemical silver reduction: The second Bi-based superconducting tape obtained after the surface scrubbing in the step 1 was connected to a positive electrode of a stabilized voltage power supply, a graphite electrode was connected to a negative electrode of the stabilized voltage power supply, and then the second Bi-based superconducting tape and the graphite electrode were arranged in parallel on a bracket; and then an electrolyte was added to allow the electrochemical silver reduction, such that a Ag alloy layer on a surface of the second Bi-based superconducting tape was removed to expose a silver layer on a surface of an outer superconducting core wire layer of the second Bi-based superconducting tape to obtain a third Bi-based superconducting tape and electrochemical additive manufactured Ag with a mass purity of 99.99% was produced on a surface of the graphite electrode. A width of the graphite electrode was 12 mm and a width of the second Bi-based superconducting tape was 4 mm, that is, the width of the graphite electrode was 3 times the width of the second Bi-based superconducting tape. A distance between the second Bi-based superconducting tape and the graphite electrode was 3.5 cm. The electrolyte was a 6 g/L $AgNO_3$ solution, and a pH of the $AgNO_3$ solution was adjusted with sodium hydroxide to 4. During the electrochemical silver reduction, a current density of the surface of the second Bi-based superconducting tape was adjusted to 5 $A/dm^2$, and a power-on time was 3 min.

Step 3: This step was the same as in Example 1.

Step 4: This step was different from Example 1 in that: A distance between the fourth Bi-based superconducting wire/

| Cost of an original tape | Cost of a total Ag material in the original tape | Cost of a copper raw material | Cost of replacement processing | Cost of the remaining Ag material in a superconducting tape | Cost of other materials and processing | Cost reduction rate |
|---|---|---|---|---|---|---|
| 100% | 96.0% | 0.31% | 0.061% | 65% | 4.0% | 30.179% |

According to test results, for the low-cost and high-strength Bi-based superconducting tape prepared in this example, a Ag mass content is reduced from 66% in the first Bi-based superconducting tape to 45%, a cost reduction rate reaches 30.179%, a breaking strength is increased from 90 MPa to 94 MPa of the first Bi-based superconducting tape to 98 MPa, and a superconducting critical tensile strength at 77 K is increased from 5 kg of the first Bi-based superconducting tape to 5.5 kg. The low-cost and high-strength Bi-based superconducting tape prepared in this example and the first Bi-based superconducting tape exhibit completely-consistape and the copper sheet was 3.5 cm. The electrochemical additive solution included 10 g/L copper sulfate and 30 g/L citric acid. During the surface enhancement, a current density of the surface of the fourth Bi-based superconducting tape was adjusted to 5 $A/dm^2$; and the surface enhancement was conducted for 10 min. A Cu layer with a thickness of 40 μm was formed on the surface of the fourth Bi-based superconducting tape to obtain a low-cost and high-strength Bi-based superconducting tape.

| Cost of an original tape | Cost of a total Ag material in the original tape | Cost of a copper raw material | Cost of replacement processing | Cost of the remaining Ag material in a superconducting tape | Cost of other materials and processing | Cost reduction rate |
|---|---|---|---|---|---|---|
| 100% | 95.5% | 0.32% | 0.064% | 64% | 4.5% | 31.451% |

According to test results, for the low-cost and high-strength Bi-based superconducting tape prepared in this example, a Ag mass content is reduced from 60% in the first Bi-based superconducting tape to 40%, a cost reduction rate reaches 31.451%, a breaking strength is increased from 90 MPa to 94 MPa of the first Bi-based superconducting tape to 124 MPa, and a superconducting critical tensile strength at 77 K is increased from 5 kg of the first Bi-based superconducting tape to 16 kg, indicating enhanced mechanical properties. The low-cost and high-strength Bi-based superconducting tape prepared in this example and the first Bi-based superconducting tape exhibit completely-consistent superconducting critical current-carrying performance, and both have a superconducting critical current of 52 A at self-field 77 K, which further confirms that the electrochemical Ag reduction and electrochemical copper deposition processes have no impact on the performance of a superconducting core wire.

In this example, copper is used instead of the precious metal Ag in the first Bi-based superconducting tape, such that a raw material cost of the first Bi-based superconducting tape is reduced by 49% without reducing the current-carrying performance. The enhanced mechanical properties allow the low-cost and high-strength Bi-based superconducting tape to be used under a magnetic field or a pressure increased by 30% or more, which broadens an application range of the Bi-based superconducting tape.

Example 5

This example was different from Example 2 in that: a distance between the fourth Bi-based superconducting wire and the copper sheet was 2 cm; the electrochemical additive solution included 3 g/L copper sulfate and 10 g/L citric acid; the surface enhancement was conducted for 10 min; and a Cu layer with a thickness of 25 μm was formed on the surface of the fourth Bi-based superconducting wire.

| Cost of an original tape | Cost of a total Ag material in the original tape | Cost of a copper raw material | Cost of replacement processing | Cost of the remaining Ag material in a superconducting tape | Cost of other materials and processing | Cost reduction rate |
|---|---|---|---|---|---|---|
| 100% | 97.0% | 0.36% | 0.073% | 61% | 3.0% | 35.939% |

According to test results, for the low-cost and high-strength Bi-based superconducting wire prepared in this example, a Ag mass content is reduced from 80% in the first Bi-based superconducting wire to 50%, such that a raw material cost of the first Bi-based superconducting tape was reduced by 30% without reducing the current-carrying performance. The low-cost and high-strength Bi-based superconducting wire prepared in this example and the first Bi-based superconducting wire exhibit completely-consistent superconducting critical current-carrying performance, and both have a superconducting critical current of 16 A at self-field 77 K, which further confirms that the electrochemical Ag reduction and electrochemical copper deposition processes have no impact on the performance of a superconducting core wire. Although the breaking strength and the superconducting critical tensile strength at 77 K of the low-cost and high-strength Bi-based superconducting wire have not been improved significantly, a critical bend radius of the low-cost and high-strength Bi-based superconducting wire has been reduced from the original 12.5 cm to 10 cm, and thus the low-cost and high-strength Bi-based superconducting wire can be used in the field requiring small bend radii.

Comparative Example 1

Mechanical Ag reduction and tin-soldering of a copper strip for enhancement were adopted. Specific steps were as follows:

An electric planer of a computer numerical control (CNC) machining center was used to allow the mechanical Ag reduction with a cutting amount of 5 μm. 10 times of the mechanical Ag reduction could successfully remove Ag on a surface of a Bi-based superconducting tape. However, although this method could lead to a high-purity Ag by-product, each pass of the mechanical Ag reduction would lead to a stress and even a strain, thereby causing a damage to a ceramic superconducting core. In addition, each pass of the mechanical Ag reduction caused a critical current of the superconducting tape to be reduced by 5% to 10%.

Similar to Example 1, a Ag content in the superconducting tape was reduced by half through this mechanical Ag reduction method, but the current-carrying performance of the superconducting tape was reduced by nearly 70%. In contrast, the electrochemical Ag reduction method in Example 1 of the present disclosure made the Ag content reduced to a same level without affecting the current-carrying performance of the superconducting tape.

After the Ag content in the superconducting tape was reduced by half through the mechanical Ag reduction, an enhancing copper strip was tin-soldered to a resulting superconducting tape, which could increase a strength of the superconducting tape to 150 Mpa. However, during the soldering, if complete natural soldering is adopted, a too-large soldering tin thickness will increase a cross-sectional area of the superconducting tape by nearly 1 time, which not only affects the dimension uniformity of the superconducting tape, but also reduces a critical engineering current density of the superconducting tape by half.

If pressure-assisted tin-soldering is adopted, soldering tin between the enhancing copper strip and the superconducting tape can be discharged as much as possible under an action of an external pressure while ensuring the soldering firmness between the enhancing copper strip and the superconducting tape and finally enhancing the dimension uniformity of the superconducting tape. However, under an action of an external pressure, a ceramic core of the Bi-based superconducting tape would also be destroyed, making the current-carrying performance of the superconducting tape reduced by about 20%.

In contrast, an electrochemical additive process was adopted for a Ag-reduced superconducting tape with the same Ag content in Example 1 of the present disclosure. Since almost no stress was introduced during the electrochemical additive process, a ceramic superconducting core of the superconducting tape was almost not affected before and after the electrochemical additive process, and thus the final current-carrying performance of the superconducting tape was not affected.

Although the mechanical Ag reduction and the copper strip soldering enhancement can nominally reduce a Ag content in a Bi-based superconducting tape and enhance a mechanical strength of the Bi-based superconducting tape, but the superconducting performance of the superconducting tape is reduced by nearly 90%. However, the electrochemical Ag reduction and electrochemical additive technologies of the present disclosure can reduce a Ag content by nearly 50% and improve mechanical properties by at least 30% or more without reducing the superconducting performance.

The above are merely preferred examples of the present disclosure, and are not intended to limit the present disclosure in any form. Any simple modifications, changes, and equivalent variations made to the above examples according to the technical essence of the present disclosure should fall within the protection scope of the technical solutions of the present disclosure.

What is claimed is:

1. A low-cost and high-strength Bi-based superconducting wire/tape prepared by a preparation method of the low-cost and high-strength Bi-based superconducting wire/tape, wherein the low-cost and high strength Bi-based superconducting wire/tape includes at least one of: Ag or an Ag alloy as a sheathing material, and a copper layer as a coating, wherein a content of the Ag in the Ag or an Ag alloy as a sheathing material is about 50%, wherein the low-cost and high-strength Bi-based superconducting wire/tape is prepared at least in part by an electrochemical silver reduction process with an ultra-low stress, wherein the low-cost and high-strength Bi-based superconducting wire/tape is fabricated by a method comprising following steps:

step 1: electrochemical silver reduction: connecting a first Bi-based superconducting wire/tape to a positive electrode of a stabilized voltage power supply, connecting a graphite electrode to a negative electrode of the stabilized voltage power supply, and arranging the first Bi-based superconducting wire/tape and the graphite electrode in parallel on a bracket; and adding an electrolyte to allow the electrochemical silver reduction, such that a Ag alloy layer on a surface of the first Bi-based superconducting wire/tape is removed to obtain a second Bi-based superconducting wire/tape; and step 2: surface enhancement: connecting the second Bi-based superconducting wire/tape obtained after the electrochemical silver reduction in the step 1 to the negative electrode of the stabilized voltage power supply, connecting a copper sheet to the positive electrode of the stabilized voltage power supply, and arranging the second Bi-based superconducting wire/tape and the copper sheet in parallel on the bracket; and adding an electrochemical additive solution to allow the surface reinforcement, such that a Cu layer is formed on a surface of the second Bi-based superconducting wire/tape to obtain the low-cost and high-strength Bi-based superconducting wire/tape, wherein:

in the step 2, a distance between the second Bi-based superconducting wire/tape and the copper sheet is 2 cm to 5 cm, a current density of the surface of the second Bi-based superconducting wire/tape is 0.1 $A/dm^2$ to 10 $A/dm^2$, the surface enhancement is conducted for 0.1 min to 20 min, and a thickness of the Cu layer is 10 μm to 40 μm.

2. The low-cost and high-strength Bi-based superconducting wire/tape prepared by the preparation method of the low-cost and high-strength Bi-based superconducting wire/tape according to claim 1, wherein:

in the step 1, a width of the graphite electrode is greater than or equal to 3 times a width or a diameter of the first Bi-based superconducting wire/tape, the electrolyte is a deionized aqueous solution comprising a soluble silver salt at a concentration of 2 g/L to 10 g/L, and a pH of the deionized aqueous solution comprising the soluble silver salt is adjusted with a metal hydroxide to 3 to 5, and the concentration of the soluble silver salt in the deionized aqueous solution is 6 g/L.

3. The low-cost and high-strength Bi-based superconducting wire/tape prepared by the preparation method of the low-cost and high-strength Bi-based superconducting wire/tape according to claim 1, wherein:

the soluble silver salt is selected from one of silver nitrate, silver fluoride, silver chlorate, and silver perchlorate, and the metal hydroxide is selected from one of sodium hydroxide, potassium hydroxide, barium hydroxide, and lithium hydroxide.

4. The low-cost and high-strength Bi-based superconducting wire/tape prepared by the preparation method of the low-cost and high-strength Bi-based superconducting wire/tape according to claim 1, wherein:

in the step 1, a distance between the first Bi-based superconducting wire/tape and the graphite electrode is 1 cm to 5 cm, a current density of a surface of the first Bi-based superconducting wire/tape is 0.1 $A/dm^2$ to 10 $A/dm^2$, and a power-on time is 0.1 min to 30 min.

5. The low-cost and high-strength Bi-based superconducting wire/tape prepared by the preparation method of the low-cost and high-strength Bi-based superconducting wire/tape according to claim 1, wherein:

in the step 2, the electrochemical additive solution is a deionized aqueous solution comprising a soluble copper salt at a concentration of 0.1 g/L to 20 g/L and an acidic substance at a concentration of 10 g/L to 50 g/L, the concentration of the soluble copper salt is 10 g/L, and the concentration of the acidic substance is 30 g/L.

6. The low-cost and high-strength Bi-based superconducting wire/tape prepared by the preparation method of the low-cost and high-strength Bi-based superconducting wire/tape according to claim 1, wherein:

the soluble copper salt is selected from one of copper sulfate, copper chloride, and copper nitrate; and/or the acidic substance is selected from one of citric acid, sulfuric acid, hydrochloric acid, nitric acid, and phosphoric acid.

7. The low-cost and high-strength Bi-based superconducting wire/tape prepared by the preparation method of the low-cost and high-strength Bi-based superconducting wire/tape according to claim 1, wherein:

before the step 1, the method further comprises cleaning a surface of the first Bi-based superconducting wire/tape with ethanol to remove residual dirt on the surface of the first Bi-based superconducting wire/tape.

8. The low-cost and high-strength Bi-based superconducting wire/tape prepared by the preparation method of the low-cost and high-strength Bi-based superconducting wire/tape according to claim 1, wherein:

before the step 2, the method further comprises soaking the second Bi-based superconducting wire/tape obtained after the electrochemical silver reduction in the step 1 in ultrapure water to remove a residual electrolyte on the surface of the second Bi-based superconducting wire/tape.

\* \* \* \* \*